(12) United States Patent
Stoyle

(10) Patent No.: US 6,850,061 B2
(45) Date of Patent: Feb. 1, 2005

(54) METHOD COMPENSATING FOR EFFECTS OF OBJECT MOTION IN AN IMAGE

(75) Inventor: Peter N R Stoyle, Worcestershire (GB)

(73) Assignee: Qinetiq Limited, Farnborough (GB)

( * ) Notice: Subject to any disclaimer, the term of this patent is extended or adjusted under 35 U.S.C. 154(b) by 0 days.

(21) Appl. No.: 10/416,308

(22) PCT Filed: Dec. 5, 2002

(86) PCT No.: PCT/GB02/05489
§ 371 (c)(1),
(2), (4) Date: May 9, 2003

(87) PCT Pub. No.: WO03/050762
PCT Pub. Date: Jun. 19, 2003

(65) Prior Publication Data
US 2004/0012390 A1 Jan. 22, 2004

(30) Foreign Application Priority Data
Dec. 8, 2001 (GB) .............................................. 0129600

(51) Int. Cl.$^7$ ................................................. G01V 3/00
(52) U.S. Cl. ...................................... 324/306; 324/307
(58) Field of Search ................................ 324/306, 307, 324/309, 300; 600/410, 419

(56) References Cited

U.S. PATENT DOCUMENTS

| 6,114,852 A | * | 9/2000 | Zhou et al. | 324/306 |
| 6,518,759 B2 | * | 2/2003 | Bernstein | 324/307 |
| 6,617,850 B2 | * | 9/2003 | Welch et al. | 324/309 |

FOREIGN PATENT DOCUMENTS

| WO | WO 98/01828 | 1/1998 |
| WO | WO 00 06245 | 2/2000 |
| WO | WO 02/086531 | 10/2002 |

OTHER PUBLICATIONS

D. Atkinson et al, "Automatic Compensation of Motion Artifacts in MRI" *Magnetic Resonance in Medicine*, vol. 41, No. 1, 1990, pp. 163–170.

* cited by examiner

Primary Examiner—Louis Arana
(74) Attorney, Agent, or Firm—Nixon & Vanderhye P.C.

(57) ABSTRACT

A method for compensation for object motion during a scan, especially an magnetic resonance imaging (MRI) scan is provided. The method involves taking a first data set corresponding to a first focussed image and adding a number of data points to form a slightly higher resolution image. Possible motions can then be modelled on the added data points and the effect on the focussing of the slightly higher resolution image determined using appropriate focus criteria.

19 Claims, 5 Drawing Sheets

METHOD COMPENSATING FOR EFFECTS OF OBJECT MOTION IN AN IMAGE

This application is the U.S. National Phase of international application PCT/GB02/05489 filed 05 Dec. 2002, which designated the U.S.

This invention relates to a method of reducing the effects of motion of objects in an image, in particular to a method of reducing the effects of motion in magnetic resonance imaging. The invention particularly relates to a method of compensating for patient motion to produce a focussed image.

Magnetic resonance imaging or MRI is a well known medical imaging technique. In essence the technique relies on the reaction of the magnetic moments of certain nuclei to applied magnetic fields. Protons and neutrons, the basic constituents of nuclei, posses magnetic dipole moments. In nuclei with an even number of protons and an even number of neutrons the net effect is no residual magnetic moment. However nuclei with uneven atomic number (or uneven atomic mass) have a net magnetic dipole and hence a magnetic moment. At room temperature in the absence of an external magnetic field one would expect to find a random orientation of magnetic moments in a medium.

In an MRI imaging system an intense magnetic field is applied to the area to be imaged. This field is applied in one direction, conventionally referred to as the z-direction. The effect of the applied field is to align the magnetic dipoles in the item being imaged. The dipoles do not all line up in exactly the same way however. The dipoles tend to adopt either an orientation lined up in the same direction as the field, referred to as parallel, or an orientation where the dipoles align opposite the field direction, the antiparallel orientation. At room temperature, due to the parallel state being slightly more energetically favourable, slightly more nuclei tend to adopt the parallel configuration than the antiparallel configuration. This results in a net overall magnetic moment for the medium, parallel to the applied field.

The coupling-effects of the magnetic moment of the nuclei with the applied field does not cause an exact alignment of the nuclear moment with the applied field. Instead the magnetic moment precesses around the applied field. The frequency of precession, called the Larmor frequency, is proportional to the strength of the applied field. The stronger the applied field the faster the rate of precession.

In effect one can consider that the dipole moments of the nuclei have aligned so there is a component of the moment in the z-direction and a component rotating in the x-y plane at the Larmor frequency. As mentioned, throughout the whole object being imaged there is a greater component parallel to the z-direction than antiparallel so there is a net moment for the object. However the components in the x-y plane are still randomly arranged in the presence of a single field so there is no net moment in the x-y plane.

Applying an RF magnetic field at the Larmor frequency perpendicular to the applied field causes the dipoles to tip into the transverse, or x-y, plane. It also causes alignment of the dipoles. The net result is then a net magnetic moment in the x-y plane rotating at the Larmor frequency.

When the RF field is removed this net magnetic moment can be measured due to the inductance caused in receiver coils. Of course once the RF field is removed the net magnetisation of the item being imaged will start to revert to what it had been as the magnetic moments of the nuclei begin to align with the z-direction again.

There are two separate decay processes that occur. The first is the increase in the z-direction component of overall magnetic moment. This is sometimes referred to as longitudinal or spin axis relaxation and is due to the transfer of energy between excited nuclei and the lattice, or nearby macro-molecules. The second process, which is independent of the first, is that the precession of the moments of the nuclei, which had been brought into in phase by the transverse rf field, start to de-phase reducing the x-y component. The de-phasing process, known as transverse relaxation or spin-spin interaction is due to transfer of energy between nuclei in different states and also from magnetic field inhomogenities. In both decay processes the different types of material present in an object, say the differing types of tissue in a patient, will affect the relaxation processes. Hence measuring the differing strengths of signal received by the different types of tissue will reveal contrast in an image.

In order to form an image it is necessary to encode the dipoles of the signals emitted by the nuclei after magnetization have information regarding to the spatial positioning of those nuclei. The imaging processes can usually be described in the following terms. First of all is the step of selecting an image slice, i.e. a small volume to be imaged, and then spatially encoding the magnetic resonance signal emanating from that slice. The basis for this is that the frequency at which a nucleus resonates, its Larmor frequency, is a function of the strength of the static magnetic field in which it is located. Therefore by altering the strength of the magnetic field as a function of position, i.e. introducing a magnetic field gradient, the Larmor frequency will also vary as a function of position.

Typically therefore a weak magnetic field that changes linearly with position is superimposed on the main static field to create a magnetic field gradient along the z-direction. An RF pulse with a narrow range of frequencies is then applied transversely. Only those nuclei whose Larmor frequency matches the frequency of the applied RF pulse will actually absorb the RF energy and undergo the tipping and alignment described above. Therefore by a careful choice of RF frequency only a narrow band or slice of the object being imaged will be excited.

Having selectively excited a slice of the object to imaged it is necessary to achieve spatial resolution within in a slice. Spatial resolution in one dimension, say the x-direction, can be achieved through use of a frequency encoding gradient. Immediately following the RF excitation pulse all spins of the nuclei of interest within the selected slice will be precessing at the same frequency. Application of an additional gradient, orthogonal to the z-direction gives spatial resolution in one dimension. This additional gradient, known as a frequency encode gradient, will alter the Larmor frequency of the spin precession across the slice and allow spatial resolution.

Note that for medical MRI the nuclei of interest is almost exclusively the nucleus of hydrogen. However other nuclei species could be of interest in certain applications. To get two dimension resolution across the slice it is necessary to use a phase encode step as well. Here following the RF excitation pulse a phase encoding gradient is applied in the y-direction for a short time. Remember that immediately following the RF excitation pulse all the spins in the selected slice will be in phase and precessing at the same frequency. If a phase encode gradient is applied in the y-direction the spins will have their resonant frequencies, and hence the rate of precession, altered according to their position along the y-direction. When the phase enode gradient is removed all nuclei in the slice will again be subject to the same static field strength and hence the spins will again start to precess at the same frequency. The effect of the phase encode gradient will have been to alter the phase of the spins according to their position along the y-axis in a known manner. The frequency encode gradient may then be re-applied.

The measured signal at a particular frequency (and therefore position along the x-axis) is the sum of all the vector contributions from a row of spins in the y-direction. The actual signal measured of course is a composite of all the frequency components along the x-axis.

To generate an image during the time that the frequency encode gradient is applied the signal is sampled $N_x$ times yielding a 'pe-line', which is a vector or line of data having $N_x$ points. Repeating the measurements $N_y$ times for differing values of the y-gradient yields a matrix of $N_x \times N_y$ amplitude points. In general to generate a final image of N×N pixels the phase encoding step must be repeated N times with different values of the phase encoding gradient.

Other acquisition schemes for slice or volume imaging exist which gather the data in different ways, however the basic principles remain the same. Also there are a number of different imaging sequences that can be applied. However in all cases the raw data collected exists in what is called k-space.

To obtain the image a Fourier transform is performed along both the x and y axes to produce a 2D spectrum of data points whose intensity is representative of signal distribution in the imaging slice.

Patient movement during the acquisition of MRI images results in degradation of the images that can obscure the clinically relevant information. Each readout period takes a few milliseconds, i.e. readout of the series of $N_x$ data points (known as a phase encode line), whereas the time interval between readouts, i.e. the next value of phase encode gradient, might be between 100 and 4000 ms. The majority of blurring and ghosting artefacts caused by patient motion are due to motion between lines in k-space, rather than motion during a single readout.

Movement leads to errors between lines of k-space which, in the resulting image, appear as blurring and ghosting, which may be in the phase encode (pe) and frequency encode (fe) directions. These errors can result from translational movement in the pe and fe directions and also rotational movement. Translations of the patient in the readout direction result in a frequency dependent phase shift in each line of k-space. Rotations in the spatial domain are also rotations in k-space and result in k-space changes that are more complicated function of position in k-space.

Various techniques have been employed to try to correct for image artefacts introduced into an image through motion. However most of the techniques known for correcting for patient motion involve a modified signal acquisition technique which may involve additional scans or even additional equipment.

International Patent Application WO98/01828 discloses a technique for reducing the effect of motion induced artefacts in an image using purely post data gathering signal processing effects. In the technique described therein the data is manipulated to counteract possible movement induced artefacts and the manipulated data compared using a focus condition to see if the image quality is improved. This technique can involve a large amount of processing due to the need to perform a high dimensional search in motion parameter space. Furthermore the method may involve the grouping of k-space lines to more accurately determine motion parameters, however this grouping can decrease the temporal resolution of the motion found.

Another method of correcting for motion induced image artefacts in the method of Projection onto Complex Sets (POCS) Hedley M, Hong Y and Rosenfeld D. "Motion Artifact Correction in MRI using generalized projections" IEEE Trans. Med. Imag., 10:40–46, 1991. This is a method whereby a good quality image is used to form a binary mask. The mask defines the tissue-air boundary, i.e. outside the mask there should be no signal. Motion induced artefacts in the acquired image cause apparent signal in the air. The POCS method sets all outside the mask in the acquired image to black. The image data is then Fourier transformed to k-space. A new complex k-space is formed from the modulus of the measured data and the phase of the estimation from the previous step. This new k-space is Fourier transformed to the image domain and the process iterates. This method however involves a large amount of Fourier transformation as the process iterates and hence involves a large amount of computational effort and hence time. Further the method requires the spatial alignment of the binary mask with the acquired image before processing which is not always possible to achieve.

The present invention seeks to provide an alternative method for correcting for motion induced artefacts in an image.

Thus according to the present invention there is provided a method of producing an image of a scanned object corrected for artefacts introduced by unwanted motion of said object during the scan comprising the steps of taking a k-space image data set comprising a number of data points derived from the object scan, forming an first data set from some of the k-space image data points, adding at least one additional data point to the first data set to form a second data set, comparing a first image generated from the first data set to a second image generated from the second data set to determine if there has been any object motion, and correcting the second image to compensate for the object motion.

An MRI image, as discussed above, is generally collected as an array of data points in k-space. Each k-space data point contributes to the whole image. Thus any set of k-space data points, which is not undersampled and includes zero spatial frequency, can be used to form an image. The resolution of the image is increased as the number of k-space space data points used to form that image is increased.

The present invention therefore lies in the comparison of a lower resolution image with a slightly higher resolution image from the same data set to determine whether there has been any motion of the object.

Conveniently the phase of the second (higher resolution) image is corrected using the phase of the first (slightly lower resolution) image. If there is motion, then the phase-corrected image will in general have a larger imaginary part than when there is no motion, and this fact can be detected and used to determine motion. Here the term image is used to denote the data set after it has undergone Fourier transform (FT) from k-space. The actual visual image is a representation of the amplitude of the image space data obtained after FT from k-space, i.e. not the phase information.

The present invention searches for possible motion only in those data points added to the first data set to form the second data set. The computation required is considerably reduced using this method as compared with other focussing methods which try to focus an entire image.

The first data set may comprise a number of phase encode lines. A phase encode line represents a series of $N_x$ data points taken after a particular phase encode gradient was applied. Conveniently the phase encode lines of the first data set symmetrically straddle DC. DC is point which corresponds to no phase encoding gradient applied and no frequency encode gradient, i.e. the zero or centre point in k-space. The data points added to the first data set to form the second data set are conveniently made up of a number of phase encode lines. Preferably two phase encode lines are added, one on either side of DC. As the data points making up a phase encode line are typically taken in a fraction of a second there will not normally be significant distortion intra line due to object motion. However a complete set of phase encode lines covering all spatial frequencies in an image can take tens of seconds to gather which can result in the need to compensate for object motions. It should of course be noted that the phase encode lines need not have been acquired sequentially in time however. Conveniently the image is built up, starting from DC, adding two lines at a time symmetrically about DC. Images are best formed by a block of pe lines symmetrically straddling DC. Therefore to avoid possible artefact it is generally preferred to add two symmetrical lines at a time when building up the image.

The term phase encode line here should not been seen as limiting. It will be apparent to the person skilled in the art that that other, non Cartesian data sets, such as generated in polar-type acquisitions, could be used in the method of the present invention. By the term phase encode line is simply meant a set of data points taken at one particular phase encode gradient value.

It can be seen that the method can be used iteratively. A certain number of lines forming a low resolution image is used as the first data set. A phase encode line is added either side of DC to build a slightly higher resolution image data set. The phase of this slightly higher resolution image, the second image, is then compared to the low resolution first image to determine if there has been any motion and, if so, correct for it. After correction the process can be repeated using the corrected slightly higher resolution image data set as the starting point and adding two further lines.

The correction is conveniently carried out on the added data points in k-space.

The method according to the present invention may be started by taking a single phase encode line, usually DC, as the first data set. The lines can then be added two at a time to build up the image. Of course any number of lines symmetrical about DC could be taken as an initial first data set if desired.

Conveniently the step of comparing the first image with the second image comprises the step of correcting the phase of the second image using the phase of the first image and analysing the phase corrected second image to determine the extent of any motion. The first and second images are complex images, with an amplitude and a phase. The first image raw or K-space is zero-padded to be the same size as the second image K-space, before the two are 2-D Fourier-transformed to (complex) image space. Effectively at each point of the second image, the phase of the corresponding point of the first image is subtracted. This is the same as dividing the second image pointwise by the first image (assuming the latter has been normalised to have unit magnitude) This results in an image which is essentially real with a small imaginary component. The extent of the imaginary component can be determined and used as the basis for determination of extent of object motion. The phase corrected second image could be used on its own or the first image could also be phase corrected and the phase corrected first image subtracted from the phase corrected second image to form a high-pass image, a feature of which is used to determine the extent of motion. Phase correction of the first image again involves dividing the first image set by the phase of the first image set to give an essential real, phase-less image which is just the modulus of the first image. Subtracting this phase-less first image from the phase corrected second image results in what may be termed a high-pass image which, in essence, gives the new information contained in the data points added to form the second data set. The imaginary component of the high pass image may conveniently be used.

Alternatively a high-pass image could be formed by the subtraction of the uncorrected complex first image from the uncorrected complex second image and a feature of this high-pass image used to determine the extent of any motion.

Conveniently the determination of object motion is performed by estimating possible object motions, correcting the added data points for the possible object motion and determining whether the corrected data points yield a more focussed image. Usefully focus criteria may be used to determine whether the image is more focussed. A number of different motion perturbations are tried on the two added lines until a pertubation or pertubations are found which minimises the focus criteria. Possible patient motions, it is sufficient to try a small finite discrete set, are tried on the two new lines. That perturbation which minimises the Focus Criterion on the image formed when compensating for that perturbation, must be the increment of patient motion which occurred.

In effect the method of the present invention presents a type of focus criterion which is physically-based on the Hermitian property of MRI scans, namely MRI scans should be purely real and phase-less. In fact for various reasons their phase is a bit more complex than that, being equal to a constant plus perturbation which is often slowly varying over the image. What the method of the present invention does is adjust the images (of increasing resolution) back to be as near real as possible, by this phase correction procedure.

Different types of translation can be compensated for separately, for instance the effect of translations can be compensated followed by compensation for any rotational displacements.

The focus criteria used may vary for different types of movement, whether they are symmetric or asymmetric about DC.

When the second data set is formed by symmetrically adding two phase encode lines to the first data set the possible translational motion may be either symmetric or asymmetric. For asymmetric translations a possible focus criteria is the energy in the imaginary part of image formed by subtracting the phase corrected first image from the phase corrected second image. The energy may conveniently be found by taking the sum of the squared magnitude. Alternatively and equivalently performing a Fourier transform along the phase encode direction of the imaginary part of the spectrum and determining the projection along the frequency encode direction may be used as a focus criterion.

For symmetric translations the focus criterion in k-space may be the sum of the squared difference between the uncorrected complex second image and uncorrected complex first image, i.e. the mean-square error between the modulus of second image and the modulus of the first image. Other focus criteria are possible however and the skilled person would be aware that other criteria could be used which are optimised for a particular scheme.

The method according to the present invention can therefore be employed to focus an image by first performing a search over asymmetric translations, and in general rotations too, to find a displacement which minimises an asymmetric focus criterion and then performing a search over symmetric displacements to find a displacement which minimises a symmetric focus criterion.

Preferably the object scan is performed with a magnetic resonance imager.

The invention will now be described by way of example only with reference to the following drawings of which;

Figure 1:
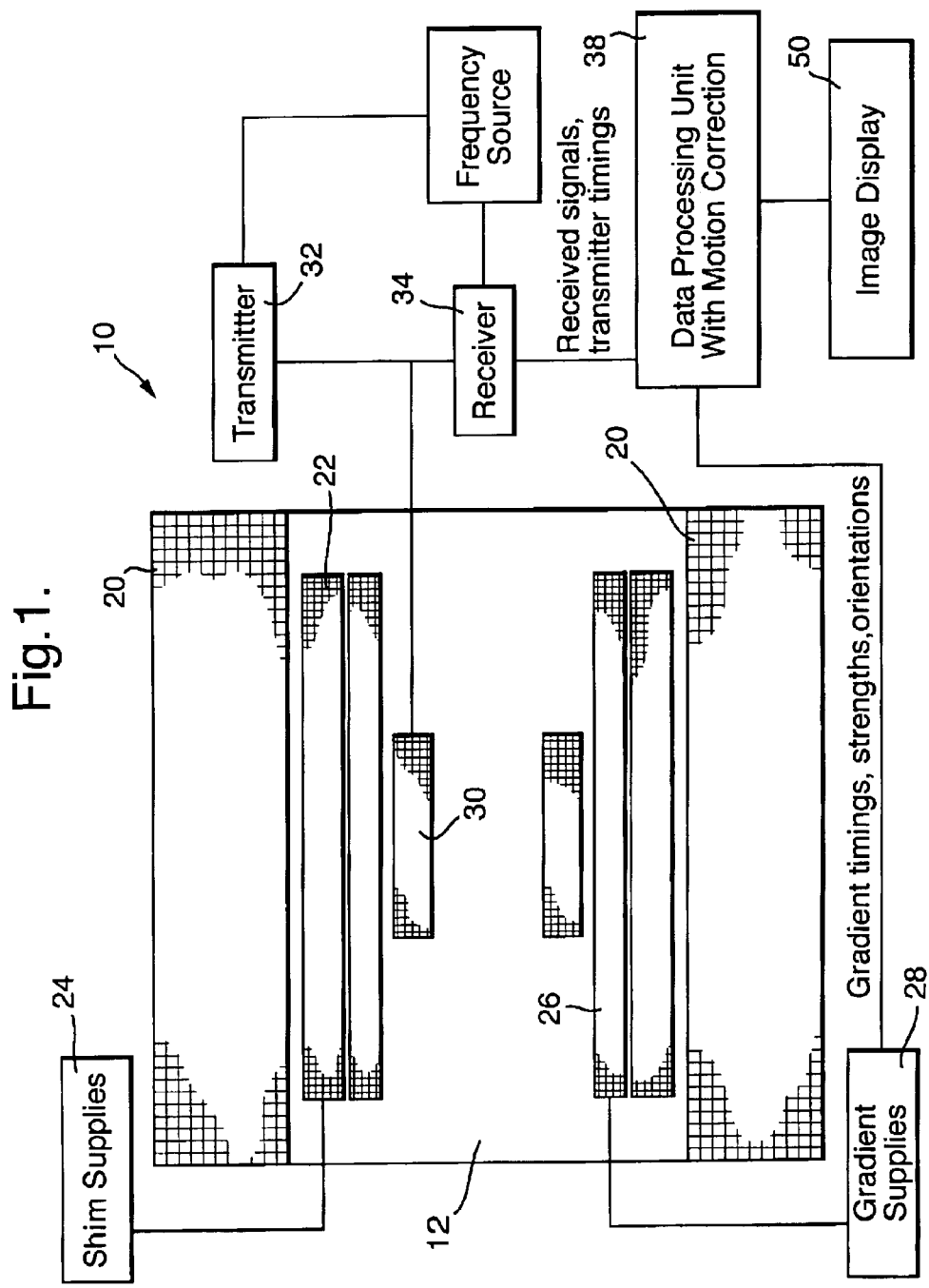
FIG. 1 shows a schematic diagram of a magnetic resonance imaging system.

Referring to FIG. 1 there is shown a schematic diagram of a magnetic resonance imaging system 10. The system 10 incorporates a magnetic resonance imaging scanner 12 of conventional type. The scanner 12 has a superconducting or resistive main magnet 20 which generates a magnetic field sufficiently strong to cause a net alignment along the field direction of atomic nuclei within a patient. The scanner 12 also includes shim coils 22 in order to correct for undesired inhomogeneities in the magnetic field of the main magnet 20. The magnetic field produced by the shim coils 22 is controlled by a shim coil power supply unit 24.

The resonance frequency of particular atomic nuclei is characteristic of the nucleus and the strength of the applied magnetic field. In order to provide spatial information a magnetic field gradient is generated by gradient coils such as coils 26. Gradient coils are often arranged to generate gradient fields in three orthogonal directions. The magnetic fields generated by the gradient coils are controlled by a gradient coil power supply unit 28. In order to generate a signal from the atomic nuclei of the patient a radio-frequency magnetic pulse is generated by transmit coil 30. This pulse 'flips' the angle of the nuclear spins within a certain patient slice of volume. These excited spins or magnetisations then induce a current in the receive coil which may be the same coil as the transmit coil 30. The coil 30 is connected to a transmit unit 32 and a receive unit 34, each of which also receives signals from a frequency source 36.

The system 10 includes a controlling computer 38 which controls the operation of the components of the system 10. The computer 38 controls the gradient coil power supply unit 28 in the form of gradient timing, magnetic field strength and orientation control. In addition, the computer receives signals from the receive unit 34 together with transmitter timings.

In order to form an image of the organs of a patient, the patient is inserted into the system 10 and a series of measurements are taken with different combinations of static and/or varying gradient fields. The signals from the tissue of the patient depend on the tissue's properties, the magnetic field gradient strengths, gradient orientations and timings with respect to the applied radio frequency pulses. The varying gradients code the received signal's phase, frequency and intensity. The received signals as a function of time form an ordered set which is stored in memory in the computer 38 for subsequent processing.

In a subsequent signal processing stage a Fourier transform may be performed on the ordered set of received signals, with the modulus of the transform being used to assign the signals to a grey scale in order to form an image. The set of received signals is said to exist in k-space.

In a conventional MRI if a patient moves during the acquisition of data the received signal is affected and part of the k-space signal is corrupted. Because of the way the image is reconstructed this motion affects the whole image, causing blurring and/or ghosting artefacts in the final image.

Figure 3B:
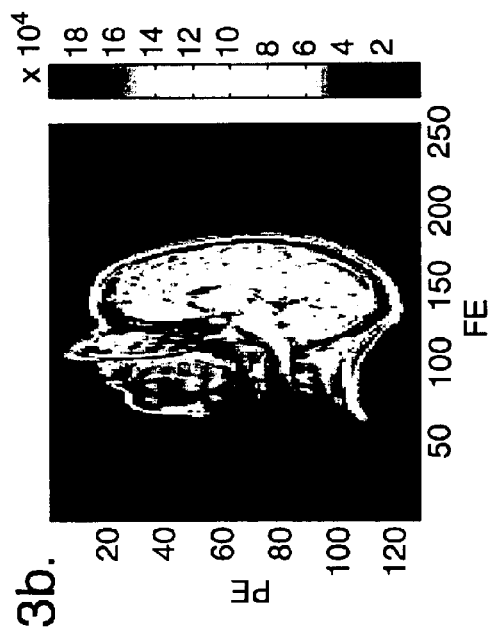
FIG. 3 shows the effect of object motion on a full resolution MRI image.
Figure 3A:
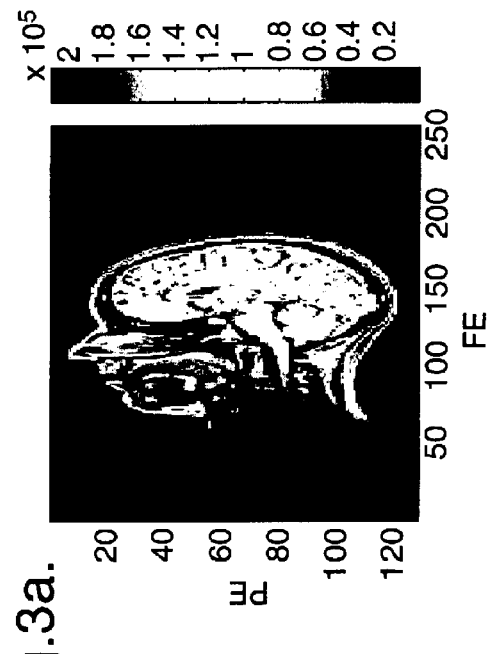

FIG. 3 shows the effect of motion on an image. FIG. 3a shows a full resolution MRI image. FIG. 3b shows the same image but with an engineered displacement. The displacement was introduced at line DC +18 and consisted of a frequency encode displacement of 1 pixel and a phase encode displacement of −2 pixels. The effect on the formed image is quite clear in that the image with a displacement is clearly less focussed and well defined. The clinical value of such an image is therefore correspondingly reduced.

Figure 2:
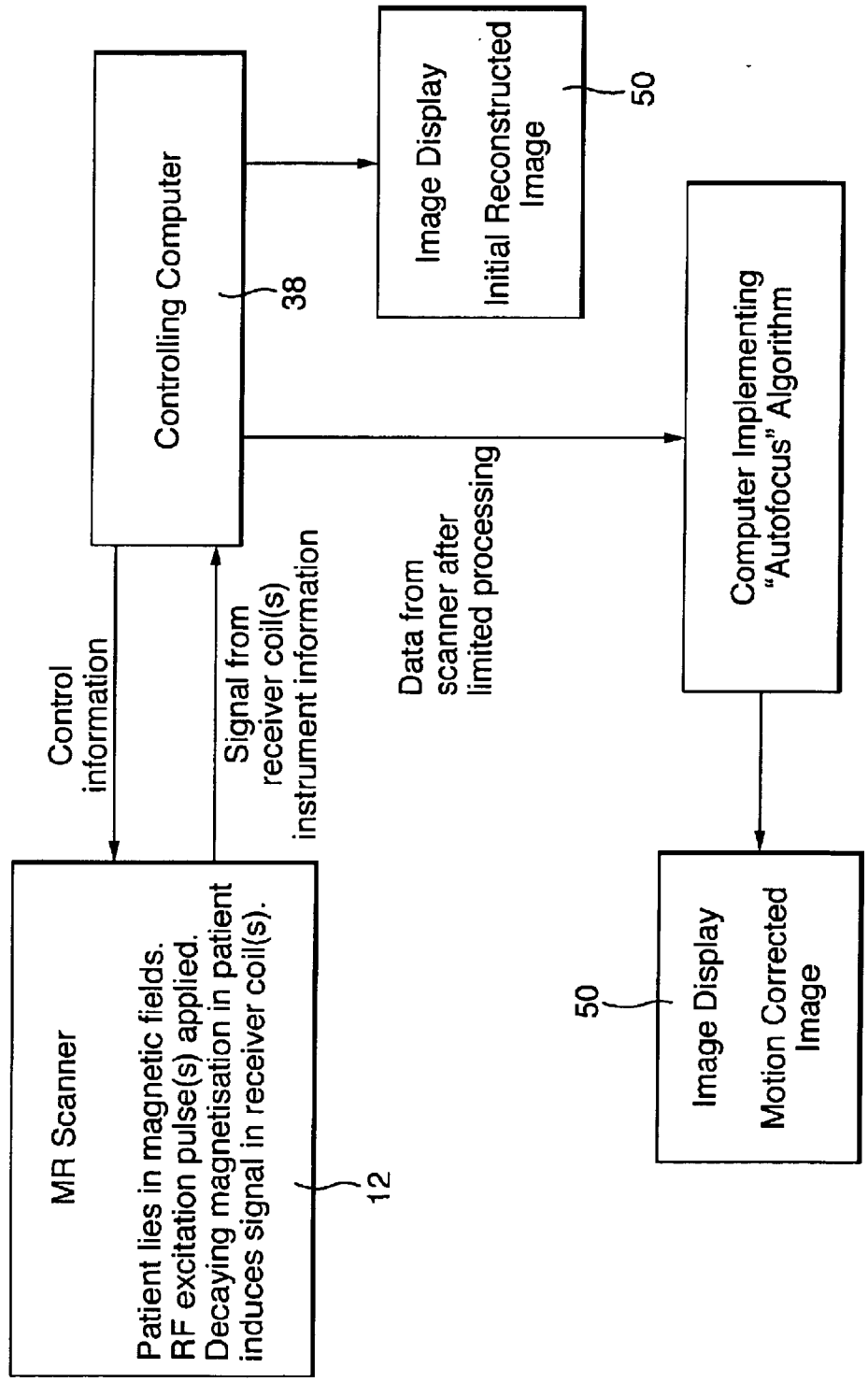
FIG. 2 shows a functional diagram of the operation of the system of FIG. 1.

Referring now to FIG. 2 there is shown a functional block diagram of the operation of the system 10. The computer 38 controls and receives information from the scanner 12 and uses this information to generate an image on display 50. This image is an initial reconstructed image. If an operator of the system 10 considers that the initial image is corrupted an additional signal processing routine is selected. Alternatively the further signal processing could occur automatically. In either case the stored image data is processed to reduce the effects of the patient's motion.

Figure 4B:
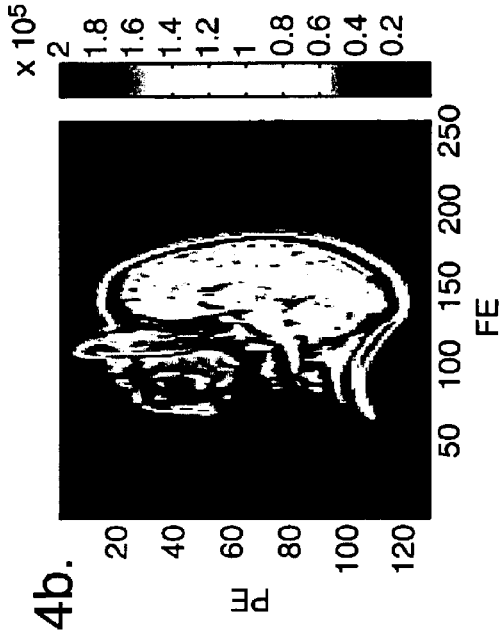
FIG. 4 shows a lower resolution image than that shown in FIG. 3.
Figure 4A:
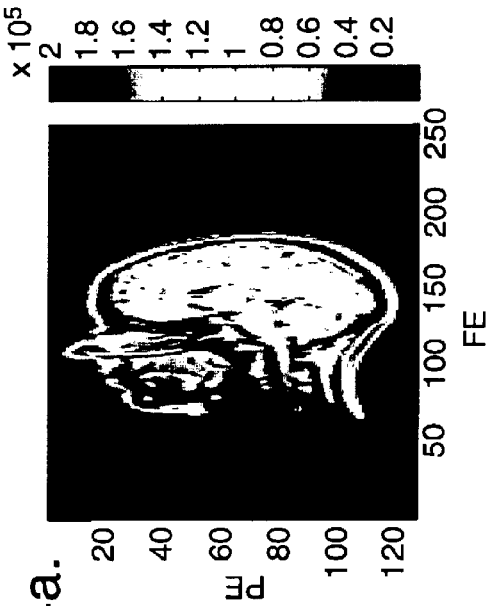

In the present invention focussing is performed by an incremental procedure of focussing a low resolution image and then proceeding to a slightly higher resolution and concentrating on just the new data points added. In one embodiment of the invention the slightly higher resolution image is formed by adding two additional phase encode lines to the low resolution image. In other words, consider 2m+1 phase encode lines, where m is a small positive integer, symmetrically straddling DC. These are the phase encode spatial frequency, or k-space, lines k where $-m \leq k \leq m$, with DC at k=0. Each phase encode (PE) line consists of $n_{fe}$ data points, i.e. the data points taken in the frequency encode direction. The $n_{fe}$ data points in a phase encode line are acquired within a fraction of a second and so normally there will be no significant image distortion arising from motion effects within a phase encode line. From this first data set of (2m+1) by $n_{fe}$ points a low resolution complex MRI image $I_{2m+1}$ is formed in the usual way by two dimensional Fourier transform (FT). FIG. 4 shows an example of a low resolution image obtained this way. The image is focussed in FIG. 4a and defocussed in FIG. 4b. As the method according to the present invention is inductive the lower resolution image is focussed at an earlier stage of the process.

The process could be started say by considering a single line at DC as focussed and building the image built up two lines at a time, symmetrically about DC.

From the focussed $I_{2m+1}$ image a $(2m+3) \times n_{FE}$ image $I_{2m+3}$ of marginally higher resolution than $I_{2m+1}$, and also straddling DC, is formed. This image is obtained by 2-D FT on the raw K-space data consisting of PE lines k where $-m-1 \leq k \leq m+1$. In general this image will not be focussed, specifically because uncompensated patient motion may have occurred at lines k=m+1 or k=−m−1. As the previous image was focussed it is necessary only to concentrate on the two new PE lines which have been added. In other words the displacement in the PE and FE directions, and the rotation occurring on those lines is determined. A patient displacement by amount a pixels on line m+1 and b pixels on line −m−1 can be decomposed as the sum of a symmetrical displacement by (a+b)/2 plus an asymmetric displacement (a−b)/2. In the 'symmetrical' case, the patient motion is by the same amount on line k=m+1 and k=−m−1. In the asymmetrical case, the motion on PE line k=−m−1 is the negative of the PM at line k=m+1. It is possible to consider the displacements, without loss of generality, to be relative to some 'reference' patient position on the DC line in k-space.

The aim is to estimate $\delta x_{sym}$, symmetric FE displacement, $\delta y_{sym}$, PE displacement, and $\delta \theta_{sym}$, angular rotation displacement of the patient, for the latest two lines added, and also the anti-symmetric displacements $\delta x_{asym}$, $\delta y_{asym}$, & $\delta \theta_{asym}$. Note that the two new lines need not in general be added sequentially in time, any normal Cartesian-type acquisition sequence of PE lines will do. Other types of acquisition, such as a 'half-Fourier' type of acquisition or polar-type spiral acquisitions could be catered for in the method of the present invention however, as would be understood by a person skilled in the art.

Once the slightly higher resolution MRI image $I_{2m+3}$ is formed the phase of this image is corrected by the phase of next lower resolution image $I_{2m+1}$, where the images are in general complex, as opposed to modulus, images. The images displayed on the image display means is a modulus image.

A phase image can be defined as a complex image divided pointwise by its corresponding modulus image. The phase image of the lower resolution image $I_{2m+1}$ can therefore be formed by dividing pointwise the complex lower resolution image by its corresponding modulus image. Letting DC0=$I_{2m+1}$, then the phase image of $I_{2m+1}$ is DC0n= DC0./D0, where ./ denotes pointwise division, and D0 is the modulus image of DC0, namely D0=|DC0|.

The higher resolution, possibly defocussed image DC2= $I_{2m+3}$ is therefore divided pointwise by the lower resolution phase image to give a phase corrected image DC2_corrected. As the resolution of an image grows incrementally, by adding PE lines symmetrically about DC, the phase of the image does not normally change very markedly. Thus the phase corrected higher resolution image, DC2_corrected, should be a largely real image, with an imaginary part which is in general small by comparison with the real part.

It is also possible to divide the lower resolution image $I_{2m+1}$ by its own phase image to give a phase corrected image DC0_corrected. This in effect is a phase-less real image with the same modulus as the lower resolution modulus image.

The phase corrected lower resolution image, DC0_corrected, may then be subtracted from the phase corrected higher resolution image to form what may be termed a high-pass image. This high-pass image in effect gives the new information, or newly resolved 'innovation', in the image due to the addition of the extra PE lines of data. When two new 'out of focus' lines are added with asymmetrical displacements due to non-zero asymmetric patient motion, then some image energy will migrate into the imaginary part of either the phase corrected higher resolution image or the high pass image formed from the difference of the two phase corrected images.

Figure 5A:
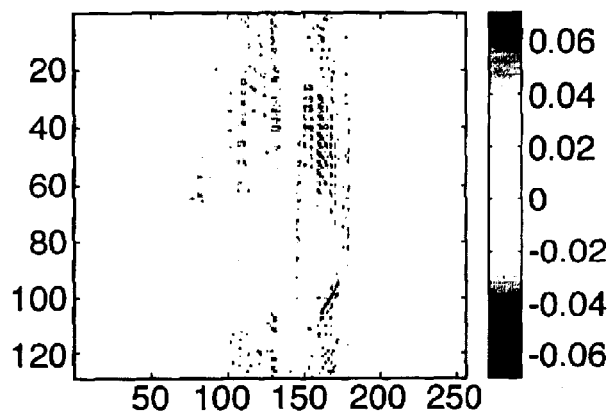
FIG. 5 shows the imaginary part of a phase corrected image according to an embodiment of the present invention.
Figure 5B:
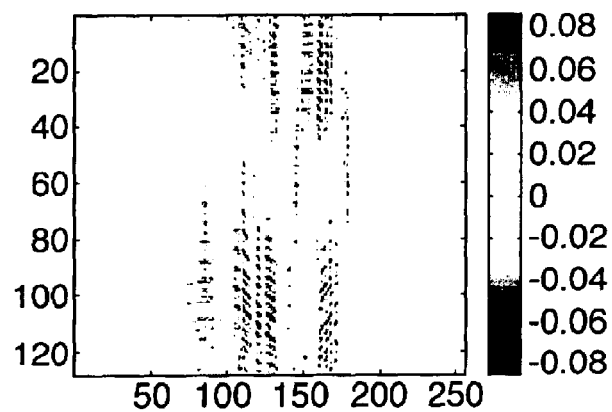

FIG. 5 shows the imaginary part of the phase corrected higher resolution image. FIG. 5a shows the case where there is no patient motion and the image is focussed whereas FIG. 5b shows the case where there is uncompensated patient motion. When out of focus due to patient motion an increased level of rippling is seen, its strength increasing with the amount of defocus. The rippling occurs largely at the spatial frequency of the added PE lines in the image and is seen in the phase encode direction.

Figure 6:
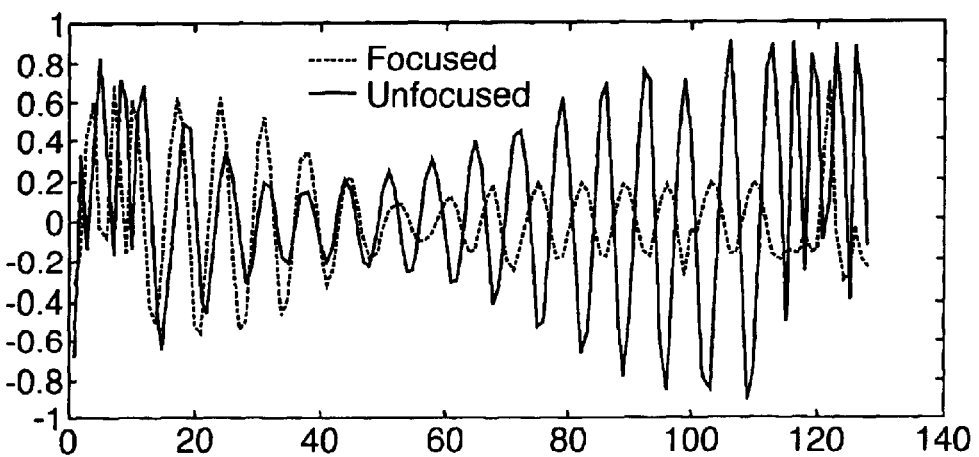
FIG. 6 shows a typical cross section through FIG. 5 in the phase encode direction.

This can be more clearly seen with reference to FIG. 6 which shows a cross section through the images of FIG. 5 taken at a frequency encode value of 119. Here it can clearly be seen that the amount of rippling increases in the unfocused case. Therefore the energy in the imaginary part of the phase corrected higher resolution image can be used as a focus criteria for determining the extent of any patient motion. The energy present in the imaginary part can be determined by forming the sum of its squared magnitude.

Figure 7:
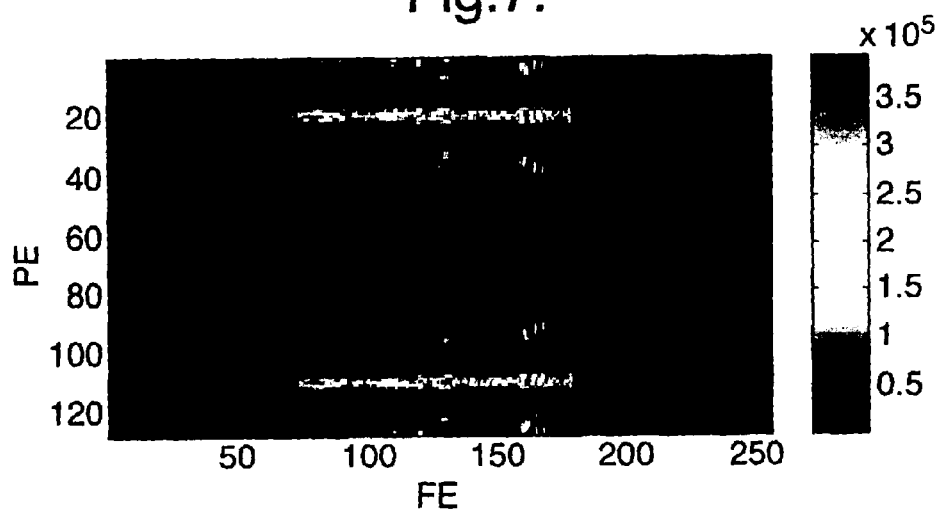
FIG. 7 shows the modulus spectrum of the imaginary part of a phase corrected image.
Figure 8:
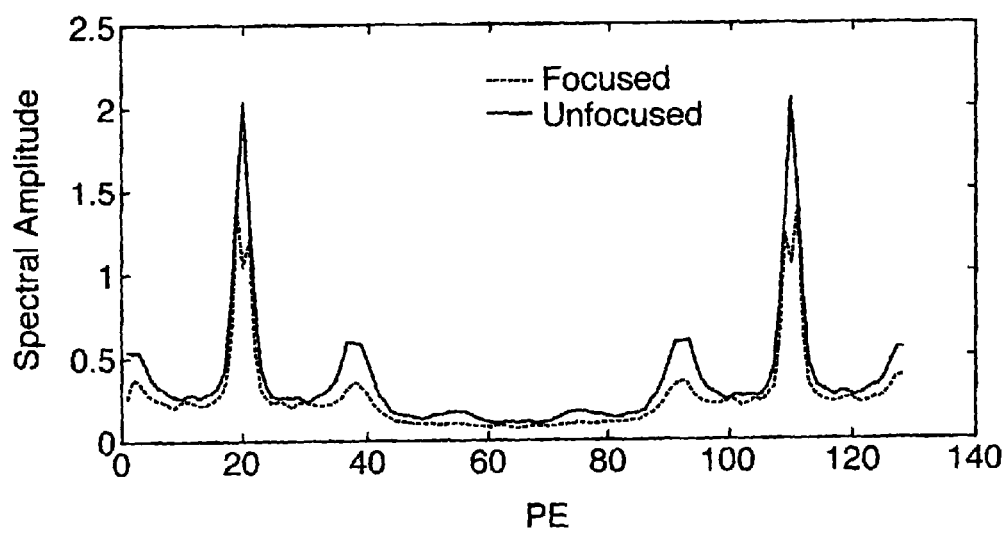
FIG. 8 shows projection of FIG. 7 on a phase encode axis.

An alternative, largely equivalent, focus criterion can be found by looking at the modulus spectrum of the imaginary part of the phase corrected higher resolution image. The image is Fourier transformed along the phase encode direction and the modulus taken pointwise. The resulting spectrum is shown in FIG. 7 for the defocussed case illustrated in FIG. 5b. This shows the rippling effect largely concentrated at the frequency of the new line of k-space which was 119. FIG. 8 shows the spectrum of FIG. 7 projected onto the vertical PE axis. Here it can again be seen that the unfocused curve has more energy. The energy under this curve may also be used as the focus criterion for asymmetric motion.

For symmetric patient motion, the above focus criteria is not in general optimal, and another should be used. This is because it can be shown that the ripple energy in the (2m+3)-line defocused image now appears more on the real part, and hence on the modulus image whose main contribution is from the real image, with only a second order contribution from the imaginary-part image. If one compares, on a mean-square basis, the low-resolution focused modulus image with the higher resolution modulus image $|I_{m+3}|$, then when there is defocus, this should manifest as a higher mean-square distance between the two images due to the increased rippling. Thus the sum of the difference between the two complex images, $I_{m+1}$ and $I_{m+3}$, squared can be used as the focus criterion for detecting symmetrical patient motion.

In one embodiment of the present invention therefore the procedure might typically proceed as follows:
i) take a first data set of a number of phase encode lines corresponding to a focussed first image,
ii) add two lines on either side of the first data set to form the second data set,
iii) apply an asymmetrical patient motion displacement (discrete) increments $\delta x_{asym}, \delta y_{asym}$, & $\delta \theta_{asym}$ on the two new lines to form a possible second data set,
iv) form a second image by a 2D FT of the possible second data set,
v) correct the phase of the second image by the phase of the first image and form a high-pass image from the difference of the phase corrected first and second images,
vi) determine the value of the asymmetric focus criterion,
vii) repeat steps (iii) to (vi) for all discrete asymmetric displacements (including zero),
viii) identify the asymmetric discrete displacements that give rise to the lowest value of the asymmetric focus criterion,
ix) apply an symmetrical patient motion displacement (discrete) increments $\delta x_{sym}, \delta y_{sym}$, & $\delta \theta_{sym}$ on the two new lines to form a possible second data set
x) form a second image by a 2D FT of the possible second data set, xi) determine the difference of the complex first image subtracted from the complex second image,
xii) determine the value of the symmetric focus criterion,
xiii) repeat steps (ix) to (xii) for all discrete symmetric displacements (including zero),
xiv) identify the discrete symmetric displacements that give rise to the lowest value of the symmetric focus criterion,
xv) correct the second data set for the identified symmetric and asymmetric displacements,
xvi) repeat steps (i) to (xv) taking the corrected second data set as the new first data set until full resolution is reached.

The search over the discrete asymmetric or symmetric displacement is a 3-D search in two dimensions aiming to find that displacement which, on compensating the image or its raw data for this motion displacement, minimises the appropriate focus criterion.

The focus criteria suggested above are formulated in terms of the imaginary part and modulus images described, but other criteria can for example also be formulated in terms of the related phase image. There are many variants of focus criteria based on phase-corrected high pass images as the skilled person will be aware.

It should be noted that, as with any focus criteria, there can be some misestimation of PE displacement near the DC line, however this is because such displacements actually have a fairly negligible effect on the subjective focus of the image, as very small PE phases are involved. Likewise there can appear to be misestimation of PE displacement on the higher frequency PE lines well away from DC. This is because the PE phase error which is caused by the displacement gets wrapped modulo $2\pi$, but this effect again causes no defocus in itself, but arises from the physics of the situation.

Justification of the chosen focus criteria is given below. Assume that a complex MRI image is just a sum over a large number of discrete points $A(x_p, y_q)$, where y denotes pe position (in the image), and x denotes fe position. Then the k-space corresponding to such an image I is $$s(k,j) = \Sigma_{p,q} A(x_p, y_q) \cdot \exp\{-2\pi j x_p/n_{fe}\} \cdot \exp\{-2\pi k y_q/n_{pe}\}$$

where $-n_{fe}/2 \leq j \leq n_{fe}/2$, $-n_{pe}/2 \leq k \leq n_{pe}/2$, assuming there are $n_{fe}+1$ points line, and $n_{pe}+1$ pe lines in total.

Form the $(2m+1) \times n_{fe}$ raw data matrix $R_{2m+1}$ obtained from putting together k-space lines $-m \leq k \leq m$. This matrix is symmetrically zero-padded out to a $n_{pe} \times n_{fe}$ matrix, and then 2-D Fourier transformed to arrive at $I_{2m+1}$. When $I_{2m+1}$ is phase-corrected as described above, in effect the complex image amplitudes $A(x_p, y_q)$ are rendered real by removing their phase, so they may henceforth be considered as real numbers.

Consider now adding the two new PE lines at $k=m+1$ & $k=-m-1$, with an asymmetric displacement $\delta x$ in FE, and $\delta y$ in PE. The new (unfocused) lines are:

$$s^{u/f}(m+1,j) = \Sigma_{p,q} A(x_p, y_q) \cdot \exp\{-2\pi j(x_p+\delta x)/n_{fe}\} \cdot \exp\{-2\pi (m+1)(y_q+\delta y/n_{pe})\}$$

where $-n_{fe}/2 \leq j \leq n_{fe}/2$. Also:

$$s^{u/f}(-m-1,-j) = \Sigma_{p,q} A(x_p, y_q) \cdot \exp\{2\pi j(x_p-\delta x)/n_{fe}\} \cdot \exp\{2\pi (m+1)(y_q-\delta y/n_{pe})\}$$

where after the image phase-correction step, the $A(x_p, y_q)$ may be considered real. We can write the above as:

$$s^{u/f}(m+1,j) = s^{foc}(m+1,j) \cdot \exp(-2\pi\{j.\delta x/n_{fe}+(m+1)\delta y/n_{pe}\}) \quad (1)$$

&

$$s^{u/f}(-m-1,-j) = s^{foc}(-m-1,-j) \cdot \exp(-2\pi\{j.\delta x/n_{fe}+(m+1)\delta y/n_{pe}\}) \quad (1')$$

Note that the patient motion manifests as phase errors on the raw k-space data.

As, to a first approximation, $\delta x$ & $\delta y$ are small, of the order of a pixel or two normally, one may write as a first approximation:

$$\exp(-2\pi\{j.\delta x/n_{fe}+(m+1)\delta y/n_{pe}\}) \cong 1 - 2\pi\{j.\delta x/n_{fe}+(m+1)\delta y/n_{pe}\} \quad (2)$$

When they are focused, the two new lines form a Hermitian pair, i.e.

$$s^{foc}(m+1,j) = \{s^{foc}(-m-1,-j)\}^*$$

where * is complex conjugate which implies the FT of the pair (i.e. the high-pass image) is real. When there is non-zero patient motion, we have, from eqns (1) & (2);

$$s^{u/f}(m+1,j) \cong s^{foc}(m+1,j) \cdot (1+\iota.c) \quad \& \quad s^{u/f}(-m-1,-j) \cong s^{foc}(-m-1,-j) \cdot (1+\iota.c)$$

where real constant $c = 2\pi\{j.\delta x/n_{fe}+(m+1)\delta y/n_{pe}\}$

Now the (phase-corrected) complex image $I_{2m+3}$ is:

$I_{2m+3} = FT(R_{2m+3}) = FT(R_{2m+1}) + FT\{2$ added lines, zero-padded$\} \cong$ Real lo-res image $I_{2m+1}$ + real high-pass image + $\iota.c$. real high-pass image The last term accounts for the appearance of an imaginary part to the phase-corrected 2m+3-line image when there is patient motion (i.e. defocus) present. This imaginary part is a high-pass image containing most of its energy (in the PE direction) at the frequency of the new lines added, namely m+1—this is the Fourier component contributed by the new lines.

In fact there are various approximations made along the way which make the above analysis only partly valid. Even the focused 2m+3-line phase-corrected image has an imaginary part—the above analysis does not take into account effects which arise from points $A(x_p, y_q)$ which are barely resolved in the low-resolution images. However it does serve to show that there will be extra contributions to the imaginary part image arising from the Hermitian mismatch in the new line pair when there is a non-zero patient motion displacement on those lines, which lends support to the choice of asymmetric focus criteria.

Likewise, when there is a symmetrical patient motion on the two lines, it can be shown that the effect is to set up oscillations on the real image, which contributes as a first order effect to oscillations in the amplitude of the modulus image $|I_{2m+3}|$. (By contrast, perturbations on the imaginary part are a second order effect). The oscillations are best detected when comparing $|I_{2m+3}|$ to $|I_{2m+1}|$, which prompts the choice of symmetric focus criteria.

The present invention has been described above in relation to one particular acquisition scheme and certain focus criteria. The skilled person would be aware however that other schemes and criteria could be used without departing from the essence of the present invention.

What is claimed is:

1. A method of producing an image of a scanned object corrected for artefacts introduced by unwanted motion of said object during the scan comprising the steps of:
    taking a k-space image data set comprising a number of data points derived from the object scan;
    forming an first data set from some of the k-space image data points;
    adding at least one additional data point to the first data set to form a second data set;
    comparing a first image generated from the first data set to a second image generated from the second data set to determine if there has been any object motion; and correcting the second image to compensate for the object motion.

2. A method as claimed in claim 1 wherein the phase of the first image is compared with the phase of the second image to determine whether there has been any object motion.

3. A method as claimed in claim 1 wherein the first data set comprises a number of phase encode lines.

4. A method as claimed in claim 3 wherein the phase encode lines of the first data set symmetrically straddle DC.

5. A method as claimed in claim 1 wherein the data points added to the first data set to form the second data set comprise a number of phase encode lines.

6. A method as claimed in claim 5 wherein the number of phase encode lines added is two.

7. A method as claimed in claim 6 wherein one phase encode line is added on each side of DC.

8. A method as claimed in claim 1 wherein the method is repeated iteratively such that after correction of the second data set the process is repeated using the corrected second data set as a new first data set.

9. A method according to claim 8 wherein the process is started taking a single phase encode line as the first data set.

10. A method according to claim 9 wherein the single phase encode line is at DC.

11. A method according to claim 1 wherein correcting the second image to compensate for the object motion correction is carried out on the added data points in k-space.

12. A method according to claim 1 wherein the step of comparing the first image and the second image comprises the step of correcting the phase of the second image using the phase of the first image and analysing the phase corrected second image to determine the extent of any motion.

13. A method as claimed in claim 12 wherein the phase of the second image is corrected by dividing it by the phase of the first image.

14. A method according to claim 12 or claim 13 wherein the analysis of the phase corrected second image comprises determining the extent of the imaginary component thereof.

15. A method as claimed in claim 12 wherein a phase corrected first image is subtracted from the phase corrected second image to form a high-pass image and a feature of the high-pass image is used to determine the extent of motion.

16. A method according to claim 15 wherein the feature of the high-pass image used is the extent of the imaginary component thereof.

17. A method as claimed in claim 1 wherein a high pass image is formed by subtracting the first image from the second image and a feature of the high-pass image is used to determine the extent of any motion.

18. A method as claimed in claim 1 wherein the determination of object motion is performed by estimating possible object motions, correcting the added data points for the possible object motion and determining whether the corrected data points give a more focussed image.

19. A method as claimed in claim 18 wherein focus criteria are used to determine whether the corrected data points give a more focussed image.

* * * * *